(12) United States Patent
Park et al.

(10) Patent No.: US 8,097,531 B2
(45) Date of Patent: Jan. 17, 2012

(54) METHODS OF MANUFACTURING CHARGE TRAP TYPE MEMORY DEVICES

(75) Inventors: Young-Geun Park, Suwon-si (KR); Jae-Young Ahn, Seongnam-si (KR); Jun-Kyu Yang, Seoul (KR); Dong-Woon Shin, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/726,014

(22) Filed: Mar. 17, 2010

(65) Prior Publication Data
US 2010/0240207 A1    Sep. 23, 2010

(30) Foreign Application Priority Data

Mar. 19, 2009 (KR) .................... 10-2009-0023338

(51) Int. Cl.
*H01L 21/3205* (2006.01)
*H01L 21/4763* (2006.01)

(52) U.S. Cl. ............... 438/594; 438/773; 257/E21.654; 257/E21.628; 257/E21.679

(58) Field of Classification Search .......... 438/594, 438/733, 771; 257/E21.654, E21.628, E21.679; 216/62, 63
See application file for complete search history.

(56) References Cited

U.S. PATENT DOCUMENTS

| | | | |
|---|---|---|---|
| 7,498,222 B1 * | 3/2009 | Foster et al. | 438/261 |
| 7,564,094 B2 | 7/2009 | Kim et al. | |
| 7,602,005 B2 * | 10/2009 | Cho et al. | 257/315 |
| 2007/0228447 A1 * | 10/2007 | Ozawa | 257/314 |
| 2008/0150008 A1 | 6/2008 | Kim et al. | |
| 2008/0188049 A1 | 8/2008 | Shim et al. | |
| 2009/0294828 A1 * | 12/2009 | Ozawa et al. | 257/319 |

FOREIGN PATENT DOCUMENTS

| | | |
|---|---|---|
| KR | 10-0652351 B1 | 11/2006 |
| KR | 10-0786707 B1 | 12/2007 |
| KR | 10-0807220 B1 | 2/2008 |

* cited by examiner

*Primary Examiner* — Caridad Everhart
(74) *Attorney, Agent, or Firm* — Myers Bigel Sibley & Sajovec, P.A.

(57) ABSTRACT

Manufacturing of a charge trap type memory device can include forming a tunnel insulating layer on a substrate. A charge-trapping layer can be formed on the tunnel insulating layer. A blocking layer can be formed on the charge-trapping layer. Gate electrodes can be formed on the blocking layer and divided by a trench. A portion of the charge-trapping layer aligned with the trench may be converted into a charge-blocking pattern with a vertical side profile by an anisotropic oxidation process.

10 Claims, 8 Drawing Sheets

METHODS OF MANUFACTURING CHARGE TRAP TYPE MEMORY DEVICES

CROSS-RELATED APPLICATION

This application claims priority under 35 USC §119 to Korean Patent Application No. 10-2009-0023338, filed on Mar. 19, 2009 in the Korean Intellectual Property Office (KIPO), the contents of which are herein incorporated by reference in their entirety.

FIELD OF THE INVENTION

Embodiments of the present invention relate to methods of manufacturing charge trap type memory devices and, more particularly, to methods of forming structures that inhibit lateral migrations of charges.

BACKGROUND

Generally, non-volatile memory devices may be classified as floating gate or charge trap type memory devices based on the structure of their unit cells.

The charge trap type memory device may include a tunnel insulating layer with silicon oxide, a charge-trapping layer, a blocking layer and a conductive electrode that are sequentially formed on a semiconductor substrate. The charge trap type memory device may perform a programming operation or an erasing operation by storing/discharging charges in/from the charge-trapping layer between the conductive electrode and the semiconductor substrate. The charges may be stored in a deep level trap of the charge-trapping layer. Thus, the tunnel insulating layer may be relatively thin. With a thin tunnel insulating layer, the charge trap type memory device may be operated at a relatively low operational voltage and which may simplify peripheral circuit structures and enable higher integration density.

In order to improve electrical characteristics, such as a threshold voltage characteristic of the charge trap type memory device, division of the charge-trapping layer including silicon nitride into unit cells like a floating gate may be desirable. This approach may inhibit lateral migration of the charges in the charge-trapping layer. To further inhibit the lateral migrations of charges, the charge-trapping layer may be patterned with an isolation layer. However, the charge-trapping layer may be damaged during the patterning process and result in deteriorated electrical characteristics.

SUMMARY

According to some embodiments, lateral migration of charges in a charge trap type memory device can be inhibited/prevented by forming a charge-blocking pattern through an anisotropic oxidation process.

According to some example embodiments, a method of manufacturing a charge trap type memory device includes forming a tunnel insulating layer on a substrate. A charge-trapping layer is formed on the tunnel insulating layer. A blocking layer is formed on the charge-trapping layer. Gate electrodes are formed on the blocking layer and are separated by a trench extending therethrough. A portion of the charge-trapping layer aligned with the trench this converted into a charge-blocking pattern having a vertical side profile by an anisotropic oxidation process.

In some further embodiments, the anisotropic oxidation process may be performed in a plasma chamber and by applying a bias voltage that directs plasma ions into a portion of the charge-trapping layer.

In some further embodiments, the charge-trapping layer may include silicon nitride. The charge-blocking pattern may include silicon oxide, silicon oxynitride, etc.

In some further embodiments, the method may include forming spacers on sidewalls of the gate electrodes. The spacers may include silicon nitride, silicon oxide, etc.

In some further embodiments, the method may include etching the blocking layer exposed through the trench after forming the gate electrodes.

According to some other example embodiments, a method of manufacturing a charge trap type memory device includes providing a substrate having an active region and an isolation layer. The active region may be stepped at the isolation layer. A tunnel insulating layer may be formed on the substrate. A charge-trapping layer may be formed on the tunnel insulating layer. An oxidation mask is configured to allow oxygen plasma ions to pass-into a portion of the charge-trapping layer on the isolation layer to convert it into a charge-blocking pattern with a vertical side profile through an anisotropic oxidation process. A blocking layer may then be formed on the charge-trapping layer electrically isolated by the charge-blocking pattern.

In some further embodiments, the oxidation mask may have a portion that is thinner than other portions thereof to allow oxygen ions to pass therethrough. The oxidation mask may have an opening that exposes the portion of the charge-trapping layer on the isolation layer, to allow option ions to pass therethrough into the charge-trapping layer.

According to some other example embodiments, a method of manufacturing a charge trap type memory device includes providing a substrate having an active region and an isolation layer. The active region may be stepped at the isolation layer. A tunnel insulating layer may be formed on the substrate. A charge-trapping layer may be formed on the tunnel insulating layer. A blocking layer may be formed on the tunnel insulating layer. An oxidation mask is formed on the blocking layer and is configured to allow oxygen plasma ions to pass therethrough into the blocking layer. The portion of the charge-trapping layer on the isolation layer may thereby be converted into a charge-blocking pattern having a vertical side profile by an anisotropic oxidation process. An electrode may be formed on a portion of the blocking layer on the charge-trapping layer and be electrically isolated by the charge-blocking pattern.

In this manner, the charge-blocking pattern may be formed by an anisotropic plasma oxidation process and without damaging the adjacent charge-trapping layer, so that characteristics of the charge-trapping layer may not be deteriorated. Further, the charge-blocking pattern may have a vertical side profile by its formation through the anisotropic oxidation process, so that lateral migrations of the charges in the charge-trapping layer may be inhibited/prevented. As a result, the charge trap type memory device may have improved electrical characteristics.

BRIEF DESCRIPTION OF THE DRAWINGS

Example embodiments will be more clearly understood from the following detailed description taken in conjunction with the accompanying drawings. FIGS. 1 to 16 represent non-limiting, example embodiments as described herein.

DETAILED DESCRIPTION OF THE EMBODIMENTS

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIGS. 1 to 4 are cross-sectional views illustrating methods of manufacturing a charge trap type memory device in accordance with some example embodiments.

Figure 1:
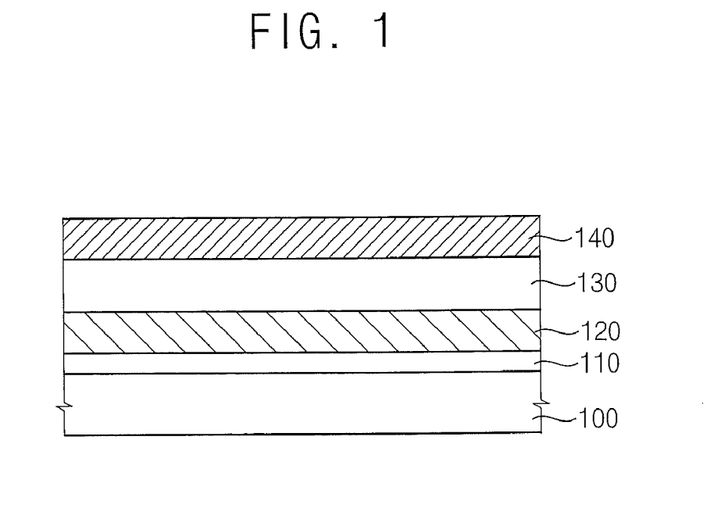
FIGS. 1 to 4 are cross-sectional views illustrating methods of manufacturing a charge trap type memory device in accordance with some example embodiments.

Referring to FIG. 1, a semiconductor substrate 100 may be prepared. The semiconductor substrate 100 may have a cell region and a peripheral region. In some example embodiments, the semiconductor substrate 100 may include a silicon substrate, a silicon-on-insulator (SOI) substrate, a germanium substrate, a germanium-on-insulator (GOI) substrate, a silicon-germanium substrate, an epitaxial substrate formed by a selective epitaxial growth (SEG) process, etc. In this example embodiment, the semiconductor substrate 100 may include the silicon substrate. Alternatively, when a charge trap type memory device may have a stacked structure, the semiconductor substrate 100 may include the epitaxial substrate.

An isolation layer (not shown) may be formed in the semiconductor substrate 100 to define an active region of the semiconductor substrate 100. A tunnel insulating layer 110 may be formed on the semiconductor substrate 100. In some example embodiments, the tunnel insulating layer 110 may function as to an energy barrier with respect to electron tunneling. The tunnel insulating layer 110 may be formed by thermally oxidizing an upper surface of the semiconductor substrate 100. Alternatively, the tunnel insulating layer 100 may be formed by a chemical vapor deposition (CVD) process. The thermal oxidation process may be performed at a temperature of about 900° C. to about 1,200° C. In order to prevent a rapid temperature change of the semiconductor substrate 100 during the thermal oxidation process, the tunnel insulating layer 110 may be formed by gradually increasing a process temperature from a room temperature to about 900° C. to about 1,200° C., and by gradually decreasing the process temperature. The thermal oxidation process may use oxygen, vapor, etc., as an oxidizing agent. The tunnel insulating layer 110 may have a thickness of no more than about 50 Å.

Although not depicted in drawings, in order to reduce a leakage current through the tunnel insulating layer 110, an additional tunnel insulating layer may be formed on the tunnel insulating layer 110. In some example embodiments, the additional tunnel insulating layer may have a thickness less than that of the tunnel insulating layer 110. The additional tunnel insulating layer may include metal oxide, metal nitride, etc. Particularly, the additional tunnel insulating layer may have a thickness of about 5 Å to about 15 Å. The additional tunnel insulating layer may be formed by an atomic layer deposition (ALD) process using aluminum oxide, aluminum nitride, hafnium oxide, zirconium oxide, tantalum oxide, titanium oxide, etc.

A charge-trapping layer 120 may be formed on the tunnel insulating layer 110. The charge-trapping layer 120 may trap charges from a channel region of the semiconductor substrate 100. In some example embodiments, the charge-trapping layer 120 may have a thickness of about 50 Å to about 100 Å. The charge-trapping layer 120 may include silicon nitride.

In some example embodiments, the charge-trapping layer 120 may have a thickness of about 70 Å by a low pressure chemical vapor deposition (LPCVD) process using an $SiH_2Cl_2$ gas and an $NH_3$ gas at a temperature of about 700° C. to about 800° C.

In some example embodiments, the charge-trapping layer 120 may include a nano crystalline material. For example, the charge-trapping layer 120 may include nano crystalline silicon, nano crystalline silicon germanium, nano crystalline metal, nano crystalline germanium, etc.

In some example embodiments, the charge-trapping layer 120 may include silicon-rich oxide. Alternatively, the charge-trapping layer 120 may include a material having a dielectric constant higher than that of silicon nitride. For example, the charge-trapping layer 120 may include metal oxide, metal oxynitride, metal silicon oxide, metal silicon oxynitride, etc. These may be used alone or in a combination thereof.

Examples of the metal that may be used for the charge-trapping layer 120 may include hafnium, zirconium, tantalum, lanthanum, cerium, praseodymium, neodymium, samarium, europium, gadolinium, terbium, dysprosium, holmium, erbium, thulium, ytterbium, lutetium, etc. These may be used alone or in a combination thereof. For example, the metal may include tantalum oxide, aluminum oxide, hafnium oxide, hafnium aluminum oxide, hafnium silicon oxynitride, etc.

In some example embodiments, the charge-trapping layer 120 may include a composite layer including at least two layers of the silicon nitride layer, the layer having the high dielectric constant, the nano crystalline layer and the silicon-rich oxide layer. The charge-trapping layer 120 may have a laminate structure where the two layers may be alternately stacked.

A blocking layer 130 may then be formed on the charge-trapping layer 120. In some example embodiments, the blocking layer 130 may block a flow of a current from a gate electrode 142 (FIG. 2) to the charge-trapping layer 120. The blocking layer 130 may include silicon oxide, metal oxide, etc. These may be used alone or in a combination thereof. Further, the blocking layer 130 may have a dielectric constant higher than that of the tunnel insulating layer 110. The blocking layer 130 may have a thickness of about 60 Å to about 200 Å, more preferably have a thickness of about 60 Å to about 150 Å, and more preferably have a thickness of about 70 Å to about 80 Å.

In some example embodiments, when the blocking layer 130 includes the silicon oxide layer, the blocking layer 130 may be formed by a radical oxidation process, a CVD process, etc.

In some example embodiments, when the blocking layer 130 includes the metal oxide layer, the blocking layer 130 may be formed by a molecular beam epitaxial growth process, a sputtering process, a CVD process, an ALD process, etc. Particularly, when the blocking layer 130 includes an aluminum oxide layer, the blocking layer 130 may be formed by the ALD process or the CVD process using an aluminum precursor and an oxidizing agent.

A conductive layer 140 may then be formed on the blocking layer 130. In some example embodiments, the conductive layer 140 may be used as a gate electrode of the charge trap type memory device. Thus, the conductive layer 140 may include a conductive material having a work function of no less than about 4.0 eV.

In some example embodiments, the conductive material may include Ti, TiN, Ta, TaN, W, WN, Hf, Nb, Mo, $Mo_2N$, RuO, $RuO_2$, Ir, $IrO_2$, Pt, Co, Cr, $Ti_3Al$, $Ti_2AlN$, Pd, WSi, NiSi, CoSi, TaSi, etc. These may be used alone or in a combination thereof.

Figure 2:
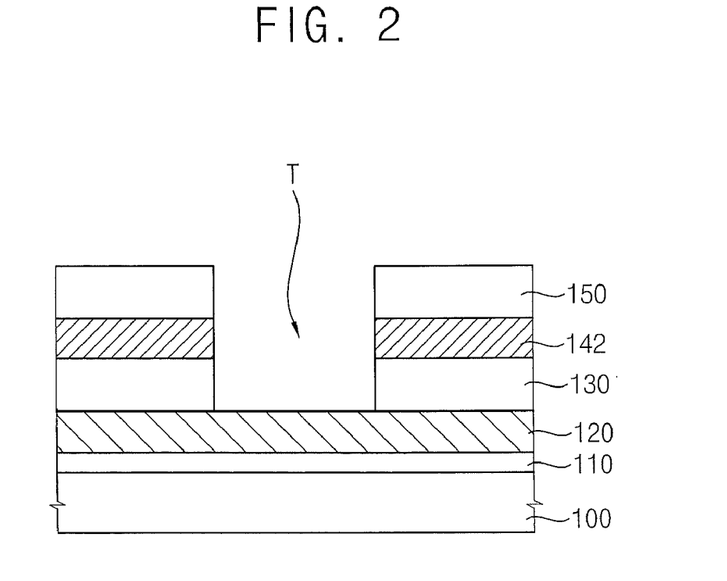

Referring to FIG. 2, a hard mask 150 may be formed on the conductive layer 140. The hard mask 150 may function to define a configuration of the gate electrode. In some example embodiments, the hard mask 150 may include silicon oxide. The hard mask 150 may have a thickness greater than that of the conductive layer 140. The thickness of the hard mask 150 may function to inhibit/prevent oxidation of the gate electrode during a plasma oxidation process for forming a charge-blocking pattern.

The conductive layer 140 may be etched using the hard mask as an etch mask to form gate electrodes 142. The gate electrodes 142 may be electrically isolated from each other by a trench T formed by the etching process. In some example embodiments, the etching process may include a dry plasma etching process.

In some example embodiments, the blocking layer 130 may function as an etch stop layer in forming the gate electrodes 142. Further, an upper portion of the blocking layer 130 may be partially removed in the anisotropic etching process.

In some example embodiments, after forming the gate electrodes 142, the blocking layer 130 may be etched until an upper surface of the charge-trapping layer 120 may be exposed.

Figure 3:
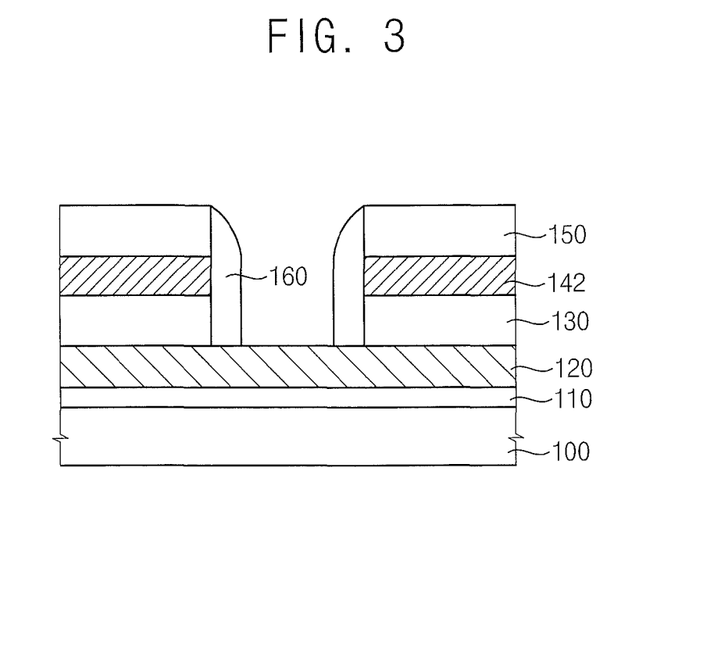

Referring to FIG. 3, a spacer 160 may be formed on sidewalls of the hard mask 150 and the gate electrodes 142 exposed through the trench T.

In some example embodiments, the spacer 160 may be formed by forming a spacer layer (not shown) having an uniform thickness on the hard mask 150 and an inner surface of the trench T, and anisotropically etching the spacer layer until a bottom surface of the trench T may be exposed. A width of the spacer 160 may be adjusted in accordance with a region where a charge-blocking pattern may be formed.

Figure 4:
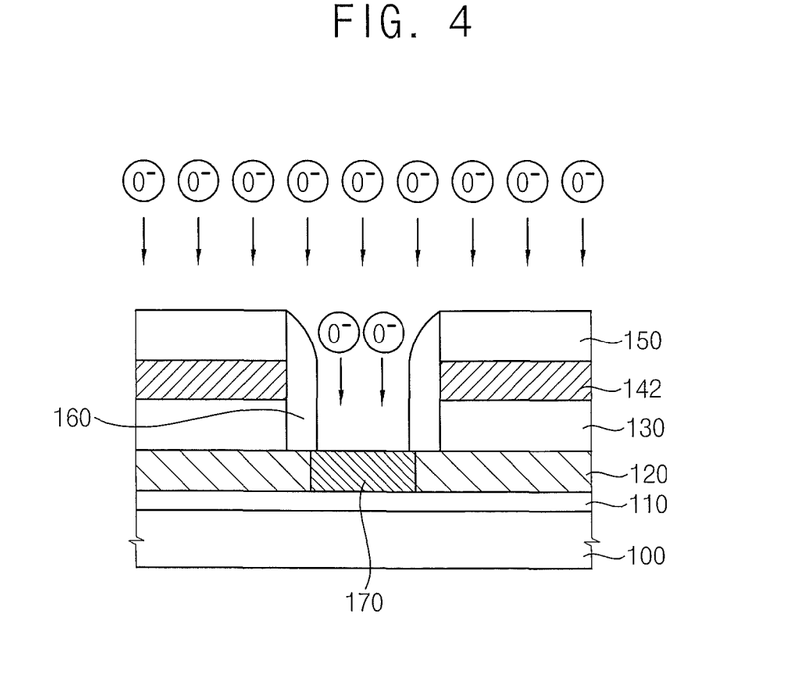

Referring to FIG. 4, a portion of the charge-trapping layer 120 exposed through the bottom surface of the trench T may be selectively oxidized by an anisotropic oxidation process to form the charge-blocking pattern 170 having a vertical side profile. That is, the exposed portion of the charge-trapping layer 120 may be converted into the charge-blocking pattern 170.

In some example embodiments, the anisotropic oxidation process may be performed in a plasma chamber to which a bias voltage is applied to provide directivity to plasma oxygen ions. Particularly, an oxygen gas may be introduced into the plasma chamber. The oxygen gas may be excited into a plasma state using a sufficiently strong electric field to form oxygen radicals, negative oxygen ions and positive oxygen ions.

The positive bias voltage may be applied to a bottom surface of the plasma chamber so that the negative oxygen ions are directed into the trench T and infiltrate into the exposed portion of the charge-trapping layer 120. Thus, the portion of the charge-trapping layer 120 exposed through the trench T may thereby be anisotropically oxidized.

As a result, because only the portion of the charge-trapping layer 120 on the isolation layer may be oxidized, the charge-blocking pattern 170 may have a vertical side profile that is self aligned to the exposed portion of the trench T between the spacers 160.

In some example embodiments, the charge-trapping layer 120 may have an oxidized thickness of about 20 Å in an X-direction and have an oxidized thickness of about 30 Å to about 40 Å in a Y-direction that is orthogonal to the X-direction. A ratio between the oxidized thicknesses along the X-direction and the Y-direction may be about 1: 3~4. Here, because the oxidation reaction may be slightly generated in the spacer 160 along the X-direction, characteristics of the spacer 160 including silicon nitride may be still maintained.

Figure 5:
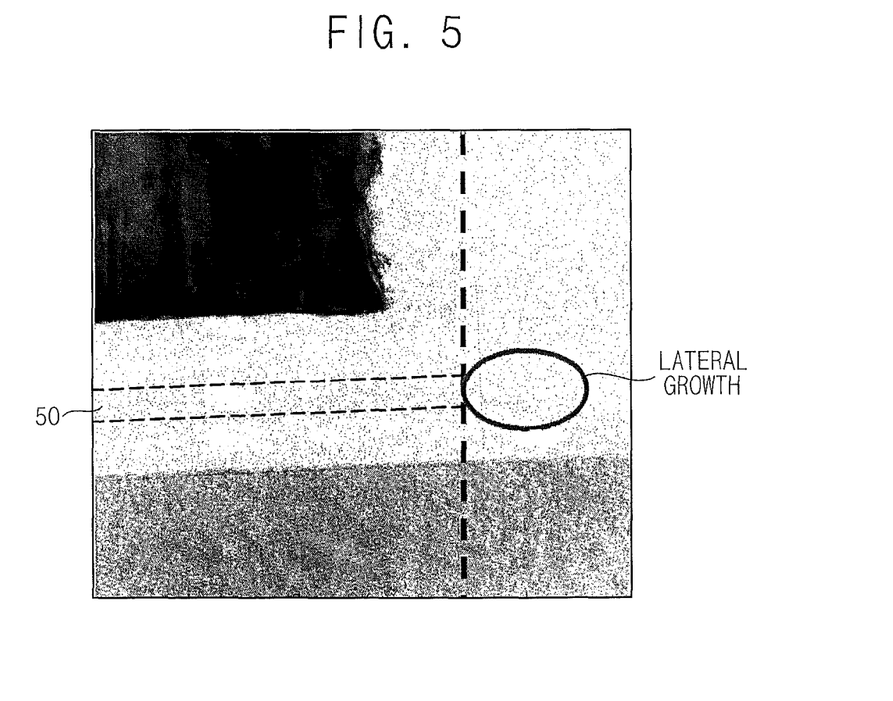
FIG. 5 is a scanning electron microscope (SEM) picture illustrating a conventional charge trap type memory device.

Using the plasma oxidation process on the charge-trapping layer 120, a sidewall of a charge-blocking pattern 50 may grow to a great extent along the X-direction as shown in FIG. 5. Thus, the anisotropic oxidation process may be used to convert the portion of the charge-trapping layer 120 into the charge-blocking pattern 170.

The charge-trapping layer 120 may thereby be divided (to form spaced apart charge-trapping layer structures) by the charge-blocking pattern, which may have a vertical side profile, so that lateral migrations of charges may be inhibited between the charge-trapping layers. Further, the charge trap type memory device may have improved characteristics through formation of the charge-blocking pattern using an ion implantation process.

Hereinafter, exemplary programming operations and erasing operations that may be carried out on the charge trap type memory device of FIG. 4 are explained.

During programming of information into the charge trap type memory device, the semiconductor substrate 100 may be grounded. A positive voltage may be applied to the gate electrode 142 to form an electric field between the semiconductor substrate 100 and the gate electrode 142, thereby generating a Fowler-Nordheim current crossing the tunnel insulating layer 110. Electrons in the channel region under the gate electrode 142 may be stored in the charge-trapping layer 120 through an energy barrier of the tunnel insulating layer 110 by the Fowler-Nordheim current. The electrons in the charge-trapping layer 120 may be blocked by the energy barrier of the blocking layer 130, so that the electrons in the charge-trapping layer 120 may not be moved into the gate electrode 142. As a result, the information may be stored in the charge trap type memory device by trapping the electrons in the charge-trapping layer 120.

In contrast, to erase information from the charge trap type memory device, the semiconductor substrate 100 may be grounded. A negative voltage may be applied to the gate electrode 142 to form an electric field between the semiconductor substrate 100 and the gate electrode 142, thereby generating a Fowler-Nordheim current crossing the tunnel insulating layer 110. The Fowler-Nordheim current may have a direction substantially opposite to that of the Fowler-Nordheim current generated by applying the positive voltage. The electrons in the charge-trapping layer 120 may be moved to the semiconductor substrate 100 through the tunnel insulating layer 110 by the Fowler-Nordheim current to erase the information from the charge trap type memory device.

FIGS. 6 to 9 are cross-sectional views illustrating methods of manufacturing a charge trap type memory device in accordance with some example embodiments.

Figure 6:
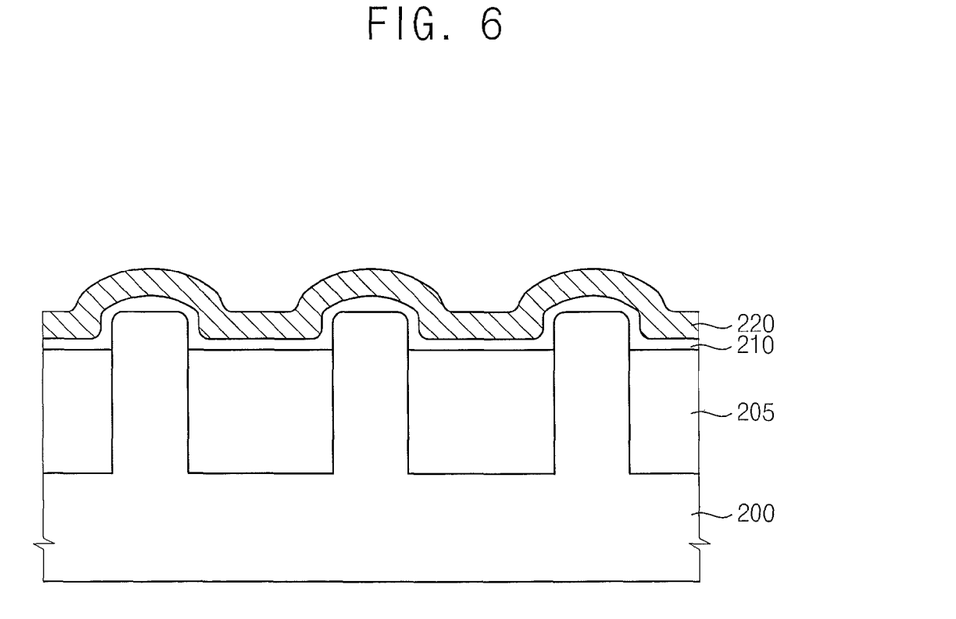
FIGS. 6 to 9 are cross-sectional views illustrating methods of manufacturing a charge trap type memory device in accordance with some example embodiments.

Referring to FIG. 6, a semiconductor substrate 200 may be prepared. Isolation layers 205 may be formed in the semiconductor substrate 200 to define an active region of the semiconductor substrate 200. In some example embodiments, the semiconductor substrate 200 may include a silicon substrate, a silicon-on-insulator (SOI) substrate, a germanium substrate, a germanium-on-insulator (GOI) substrate, a silicon-germanium substrate, an epitaxial substrate formed by a selective epitaxial growth (SEG) process, etc. The isolation layers 205 may have upper surfaces lower than that of the semiconductor substrate 200. Thus, the upper surfaces of the isolation layers 205 may be lower than an upper surface of the active region. As a result, the semiconductor substrate 200 may have a stepped portion (profile) due to the isolation layers 205.

A tunnel insulating layer 210 may be formed on the semiconductor substrate 200. In some example embodiments, the tunnel insulating layer 210 may function as an energy barrier with respect to electron tunneling. The tunnel insulating layer 210 may be formed by thermally oxidizing an upper surface of the semiconductor substrate 200. Alternatively, the tunnel insulating layer 210 may be formed by a chemical vapor deposition (CVD) process.

Although not depicted in drawings, in order to reduce a leakage current through the tunnel insulating layer 210, an additional tunnel insulating layer may be formed on the tunnel insulating layer 210. In some example embodiments, the additional tunnel insulating layer may have a thickness less than that of the tunnel insulating layer 210. The additional tunnel insulating layer may include metal oxide, metal nitride, etc.

A charge-trapping layer 220 may be formed on the tunnel insulating layer 210. The charge-trapping layer 220 may trap charges from a channel region of the semiconductor substrate 200. In some example embodiments, the charge-trapping layer 220 may have a thickness of about 50 Å to about 100 Å. The charge-trapping layer 220 may include silicon nitride.

In some example embodiments, the charge-trapping layer 220 may be formed to have a thickness of about 70 Å using a low pressure chemical vapor deposition (LPCVD) process with an $SiH_2Cl_2$ gas and an $NH_3$ gas at a temperature of about 700° C. to about 800° C.

In some example embodiments, the charge-trapping layer 220 may include a nano crystalline material. For example, the charge-trapping layer 220 may include nano crystalline silicon, nano crystalline silicon germanium, nano crystalline metal, nano crystalline germanium, etc.

In some example embodiments, the charge-trapping layer 220 may include silicon-rich oxide. Alternatively, the charge-trapping layer 220 may include a material having a dielectric constant higher than that of silicon nitride.

Figure 7:
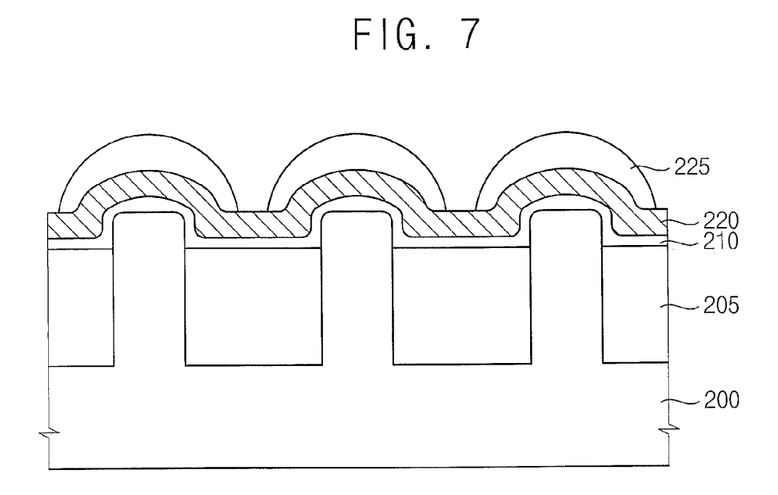

Referring to FIG. 7, an oxidation mask 225 may be formed on the charge-trapping layer 220. In some example embodiments, the oxidation mask 225 may have a structure configured to allow oxygen plasma ions to pass through toward portions of the charge-trapping layer 220 over the isolation layers 205.

In some example embodiments, the oxidation mask 225 may have openings configured to expose the portions of the charge-trapping layer 220 over the isolation layers 205. The oxidation mask 225 may be formed by forming a silicon oxide layer on the charge-trapping layer 220, and etching the silicon oxide layer until an upper surface of the charge-trapping layer 220 may be exposed. The silicon oxide layer may be formed by a PECVD process.

Although not depicted in drawings, the oxidation mask 225 may include a portion over the isolation layers 205, and other portions. The oxidation mask 225 over a portion of the isolation layers 205 may have a thickness that allows oxygen plasma ions to pass therethrough. Thus, the oxidation mask 225 over a portion of the isolation layers 205 may be less thick than other portions in the oxidation mask 225.

In some example embodiments, the oxidation mask 225 may be formed by forming a silicon oxide layer, and etching the silicon oxide layer using a photoresist pattern as an etch mask.

Figure 8:
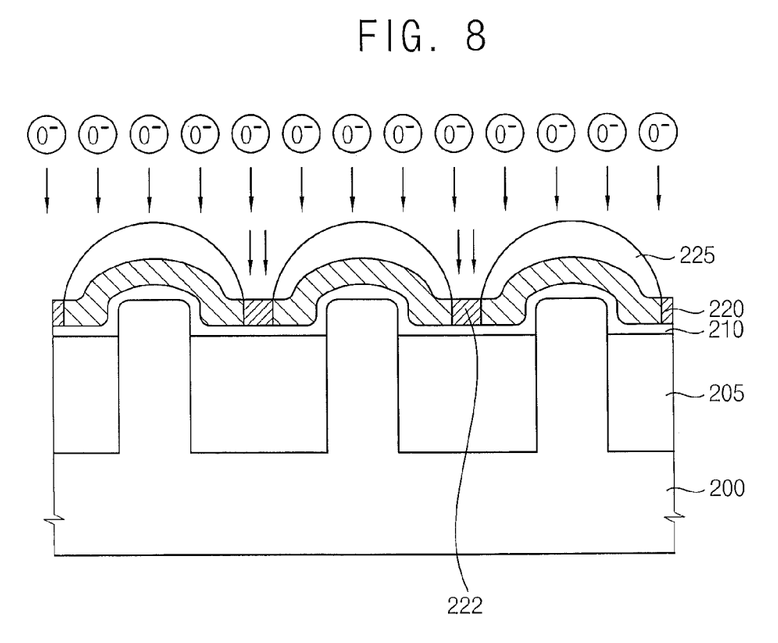

Referring to FIG. 8, a portion of the charge-trapping layer 220 exposed through the oxidation mask 225 may be selectively oxidized by an anisotropic oxidation process to form the charge-blocking pattern 222 which can have a vertical side profile.

In some example embodiments, the anisotropic oxidation process may be performed in a plasma chamber to which a bias voltage for providing plasma oxygen ions with directivity into the isolation layers 205. Particularly, an oxygen gas may be introduced into the plasma chamber. The oxygen gas may be excited into plasma state by application of a sufficient electric field to form oxygen radicals, negative oxygen ions and positive oxygen ions.

Here, the positive bias voltage may be applied to a bottom surface of the plasma chamber so that the negative oxygen ions are directed thereto. The negative oxygen ions can be directed to infiltrate into the portion of the charge-trapping layer 220 through the openings of the oxidation mask 225 or through a portion of the oxidation mask 225 that is sufficiently thin to allow the negative oxygen ions to pass therethrough. The portion of the charge-trapping layer 220 can thereby be anisotropically oxidized, which can suppress lateral oxidation of the charge-trapping layer 220 and cause the charge-blocking pattern 222 to have a vertical side profile.

In some example embodiments, the charge-trapping layer 220 may have an oxidized thickness of about 20 Å in an X-direction and have an oxidized thickness of about 30 Å to about 40 Å in a Y-direction that is orthogonal to the X-direction. A ratio between the oxidized thicknesses along the X-direction and the Y-direction may be about 1: 3~4.

The oxidation mask 225 may then be removed by an etching process.

Figure 9:
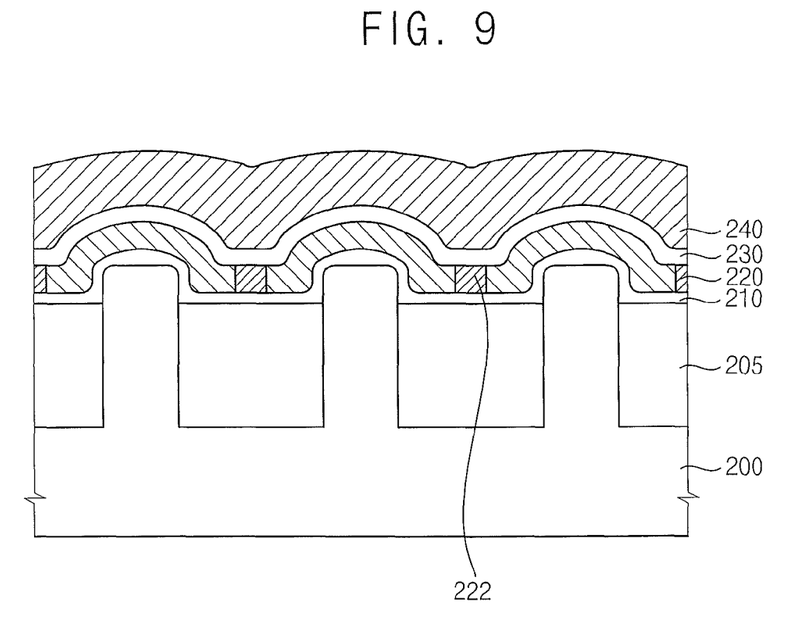

Referring to FIG. 9, a blocking layer 230 may then be formed on the charge-trapping layer 220 and the charge-blocking layer 222. In some example embodiments, the blocking layer 230 may block current flow from a gate electrode (not shown) to the charge-trapping layer 220. The blocking layer 230 may include silicon oxide, metal oxide, etc. These may be used alone or in a combination thereof. Further, the blocking layer 230 may have a dielectric constant higher than that of the tunnel insulating layer 210.

In some example embodiments, when the blocking layer 230 includes the silicon oxide layer, the blocking layer 230 may be formed by a radical oxidation process, a CVD process, etc.

In some example embodiments, when the blocking layer 230 includes the metal oxide layer, the blocking layer 230 may be formed by a molecular beam epitaxial growth process, a sputtering process, a CVD process, an ALD process, etc. Particularly, when the blocking layer 230 includes an aluminum oxide layer, the blocking layer 130 may be formed by the ALD process or the CVD process using an aluminum precursor and an oxidizing agent.

A gate electrode 240 may be formed on the blocking layer 230. In some example embodiments, the gate electrode 240 may be formed by forming a conductive layer (not shown) on the blocking layer 230 and then patterning the conductive layer. The process for forming the gate electrode 240 may be substantially the same as that for forming the gate electrode 142 in FIGS. 1 to 4. Thus, any further illustrations with respect to the process for forming the gate electrode 240 are omitted herein for brevity.

The charge-trapping layer may thereby be divided by the charge-blocking pattern, which may have a vertical side profile, so that lateral migrations of charges may be inhibited/prevented between the charge-trapping layers. Formation of the charge-blocking pattern by the ion implantation process may improve operational characteristics of the charge trap memory device.

FIGS. 10 to 13 are cross-sectional views illustrating methods of manufacturing a charge trap type memory device in accordance with some example embodiments.

Figure 10:
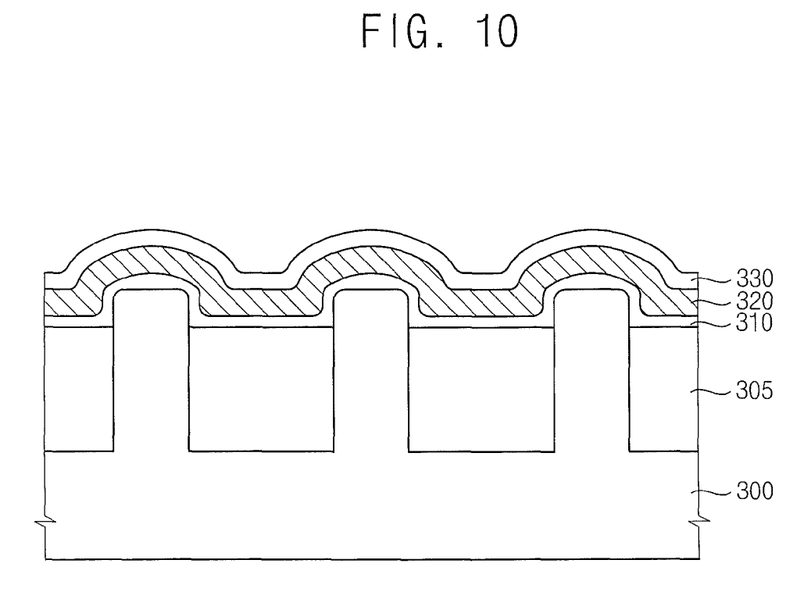
FIGS. 10 to 13 are cross-sectional views illustrating methods of manufacturing a charge trap type memory device in accordance with some example embodiments.

Referring to FIG. 10, a semiconductor substrate 300 may be prepared. Isolation layers 305 may be formed in the semiconductor substrate 300 to define an active region of the semiconductor substrate 300. The isolation layers 305 may have upper surfaces lower than that of the semiconductor substrate 300. Thus, the upper surfaces of the isolation layers 305 may be lower than an upper surface of the active region.

A tunnel insulating layer 310 may be formed on the semiconductor substrate 300. In some example embodiments, the tunnel insulating layer 310 may function as an energy barrier with respect to electron tunneling. The tunnel insulating layer 310 may be formed by thermally oxidizing an upper surface of the semiconductor substrate 300. Alternatively, the tunnel insulating layer 310 may be formed by a chemical vapor deposition (CVD) process.

Although not depicted in drawings, in order to reduce a leakage current through the tunnel insulating layer 310, an additional tunnel insulating layer may be formed on the tunnel insulating layer 310. In some example embodiments, the additional tunnel insulating layer may have a thickness less than that of the tunnel insulating layer 310. The additional tunnel insulating layer may include metal oxide, metal nitride, etc.

A charge-trapping layer 320 may be formed on the tunnel insulating layer 310. The charge-trapping layer 320 may trap charges from a channel region of the semiconductor substrate 300. In some example embodiments, the charge-trapping layer 320 may have a thickness of about 50 Å to about 100 Å. The charge-trapping layer 320 may include silicon nitride.

In some example embodiments, the charge-trapping layer 320 may include a nano crystalline material. Alternatively, the charge-trapping layer 320 may include a material having a dielectric constant higher than that of silicon nitride.

A blocking layer 330 may then be formed on the charge-trapping layer 320. In some example embodiments, the blocking layer 330 may block a flow of a current from a gate electrode 340 (FIG. 13) to the charge-trapping layer 320. The blocking layer 330 may include silicon oxide, metal oxide, etc. These may be used alone or in a combination thereof. Further, the blocking layer 230 may have a dielectric constant higher than that of the tunnel insulating layer 310.

In some example embodiments, when the blocking layer 330 includes the silicon oxide layer, the blocking layer 330 may be formed by a radical oxidation process, a CVD process, etc.

In some example embodiments, when the blocking layer 330 includes the metal oxide layer, the blocking layer 330 may be formed by a molecular beam epitaxial growth process, a sputtering process, a CVD process, an ALD process, etc. Particularly, when the blocking layer 330 includes an aluminum oxide layer, the blocking layer 330 may be formed by the ALD process or the CVD process using an aluminum precursor and an oxidizing agent.

In this example embodiment, the blocking layer 330 may include a middle temperature oxide layer and an aluminum layer.

Figure 11:
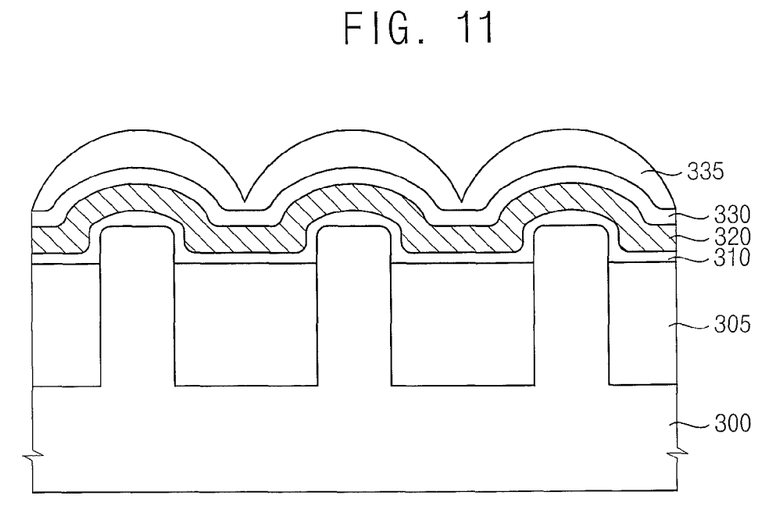

Referring to FIG. 11, an oxidation mask 335 may be formed on the charge-trapping layer 320. In some example embodiments, the oxidation mask 325 may have a structure configured to oxygen plasma ions to pass therethrough toward portions of the charge-trapping layer 320 over the isolation layers 305.

In some example embodiments, the oxidation mask 335 may be formed by forming a silicon oxide layer on the charge-trapping layer 320, and etching the silicon oxide layer until an upper surface of the charge-trapping layer 320 is exposed. The silicon oxide layer may be formed by a PECVD process.

Although not depicted in drawings, the oxidation mask 335 may have openings configured to expose the portions of the charge-trapping layer 320 over the isolation layers 305. The oxidation mask 335 may be formed by forming a silicon oxide layer on the charge-trapping layer 320, and etching the silicon oxide layer until an upper surface of the charge-trapping layer 320 may be exposed to form the openings.

In some example embodiments, the oxidation mask 335 may be formed by forming a silicon oxide layer, and etching the silicon oxide layer using a photoresist pattern as an etch mask.

Figure 12:
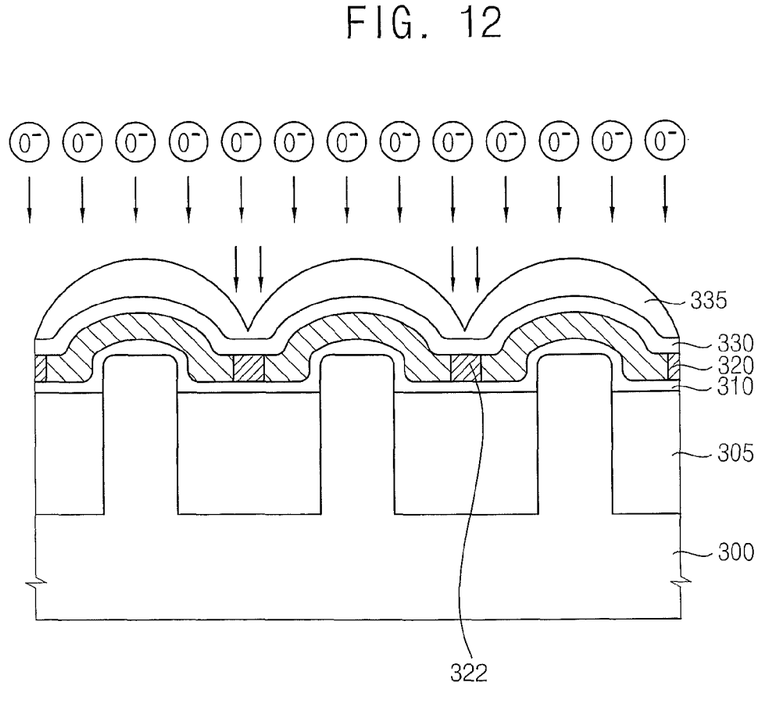

Referring to FIG. 12, a portion of the charge-trapping layer 320 exposed through the oxidation mask 335 may be selectively oxidized by an anisotropic oxidation process to form the charge-blocking pattern 322 with a vertical side profile.

In some example embodiments, the anisotropic oxidation process may be performed in a plasma chamber and with application of a bias voltage to provide implantation directivity to the plasma oxygen ions. Particularly, an oxygen gas may be introduced into the plasma chamber. The oxygen gas may be excited into a plasma state using a sufficiently strong electric field to form oxygen radicals, negative oxygen ions and positive oxygen ions.

A positive bias voltage may be applied to a bottom surface of the plasma chamber to provide directivity to the negative oxygen ions. The negative oxygen ions may infiltrate (implant) into the portion of the charge-trapping layer 320 through the openings of the oxidation mask 335 or through a sufficiently and then portion of the oxidation mask 335. Thus, the portion of the charge-trapping layer 320 may be anisotropically oxidized. As a result, lateral oxidation of the charge-trapping layer 320 may be suppressed and the charge-blocking pattern 322 may have a vertical side profile.

Further, because the plasma oxygen ions may infiltrate into the blocking layer 330, the blocking layer 330 may have improved inner density.

The oxidation mask 335 may then be removed by an etching process.

Figure 13:
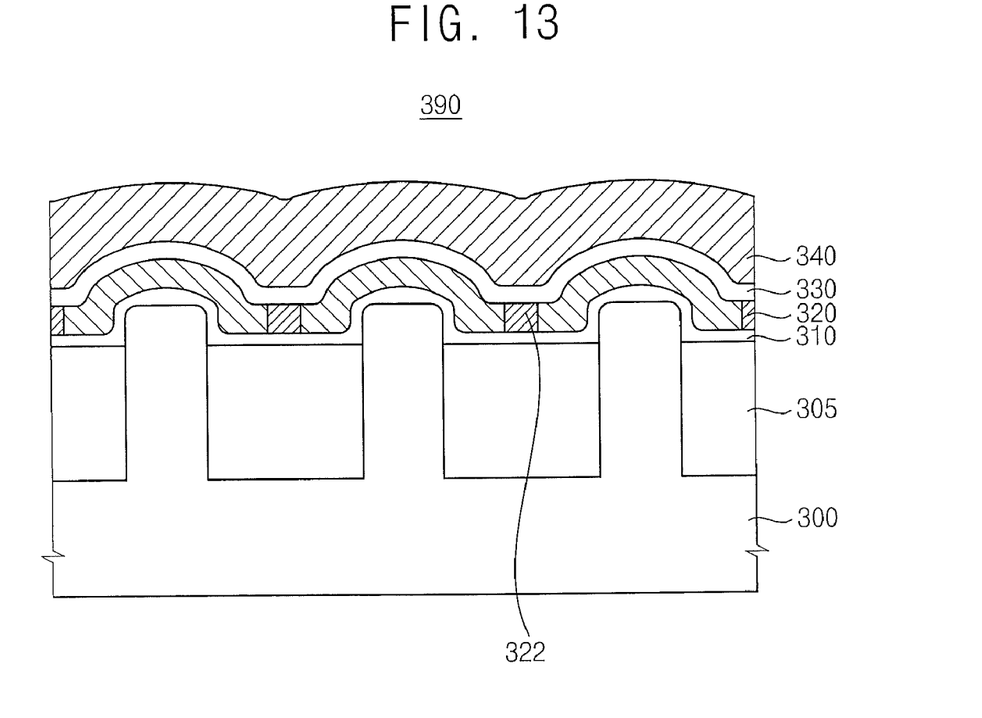

Referring to FIG. 13, a gate electrode 340 may be formed on the blocking layer 330. In some example embodiments, the gate electrode 340 may be formed by forming a conductive layer (not shown) on the blocking layer 330, and patterning the conductive layer. The process for forming the gate electrode 340 may be substantially the same as that for forming the gate electrode 142 in FIGS. 1 to 4. Thus, any further illustrations with respect to the process for forming the gate electrode 340 are omitted herein for brevity.

The charge-trapping layer may thereby be divided by the charge-blocking pattern, which may have a vertical side profile, so that lateral migrations of charges may be inhibited/prevented between the charge-trapping layers. Because the charge-blocking pattern can be formed using an ion implantation process, the charge trap type memory device may have improved characteristics.

Figure 14:
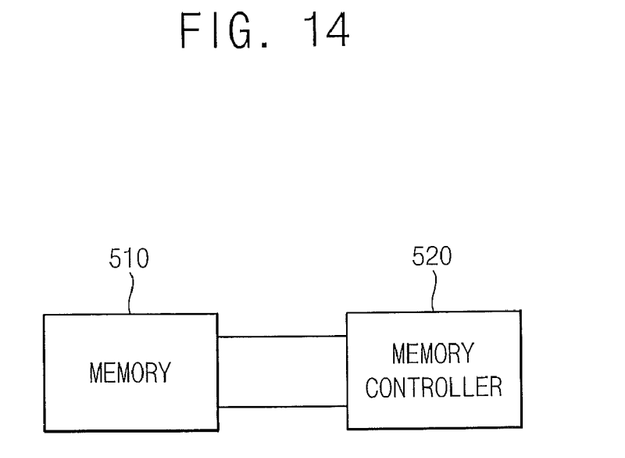
FIG. 14 is a block diagram illustrating an electronic device including the charge trap type memory device in accordance with some example embodiments.

FIG. 14 is a block diagram illustrating an electronic device including the charge trap type memory device in accordance with some example embodiments.

Referring to FIG. 14, a memory system of this example embodiment may include a memory controller 520 and a memory 510. The memory 510 may include any one of the charge trap type memory devices in accordance with these example embodiments.

The memory 510 may be used as the DRAM device of the example embodiment. The memory controller 520 may input a signal into the memory 510 to control operations of the memory 510. In some example embodiments, the signal may include a command signal, an address signal, an input/output signal, etc. The memory controller 520 may control data in the DRAM device in accordance with the signal.

Figure 15:
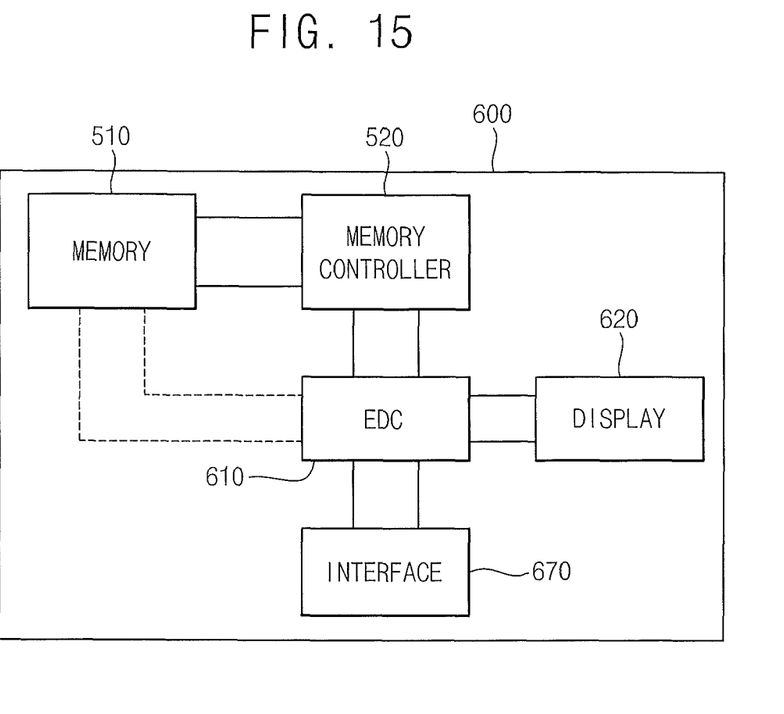
FIG. 15 is a block diagram illustrating an electronic device including the charge trap type memory device in accordance with some example embodiments.

FIG. 15 is a block diagram illustrating an electronic device including the charge trap type memory device in accordance with some example embodiments.

Referring to FIG. 15, a portable device 600 of this example embodiment may include an MP3 player, a video player, etc. The portable device 600 may include a memory 510 and a memory controller 520. In some example embodiments, the portable device 600 may also include an encoder/decoder 610, a display 620 and an interface 670. The memory 510 may include any one of the charge trap type memory devices in accordance with these example embodiments.

Data may be inputted/outputted into/from the memory 510 through the memory controller 520 by the encoder/decoder 610. As shown dotted lines in FIG. 15, the data may be directly inputted into the memory 510. Further, the data may be outputted from the encoder/decoder 610 from the memory 510.

The encoder/decoder 610 may encode the data in the memory 510. For example, the encoder/decoder 610 may perform an MP3 encoding and a PMP encoding for storing the data in an audio player and a video player. Alternatively, the encoder/decoder 610 may perform an MPEG encoding for storing video data in the memory 510. Further, the encoder/decoder 610 may include a multi-encoder for encoding data having different types in accordance with different formats. For example, the encoder/decoder 610 may include an MP3 encoder for audio data and an MPEG encoder for video data.

In some example embodiments, the encoder/decoder 610 may include only a decoder. For example, the decoder may receive and transmit data to the memory controller 520 or the memory 510.

In some example embodiment, the encoder/decoder 610 may receive data for encoding or encoded data through the interface 630. The interface 630 may include a USB interface. The data may be outputted from the interface 630 through the memory 510.

The displayer 620 may display the data outputted from the memory 510 or decoded by the encoder/decoder 610. For example, the displayer 620 may include a speaker jack for outputting audio data, a display screen for outputting video data, etc.

Figure 16:
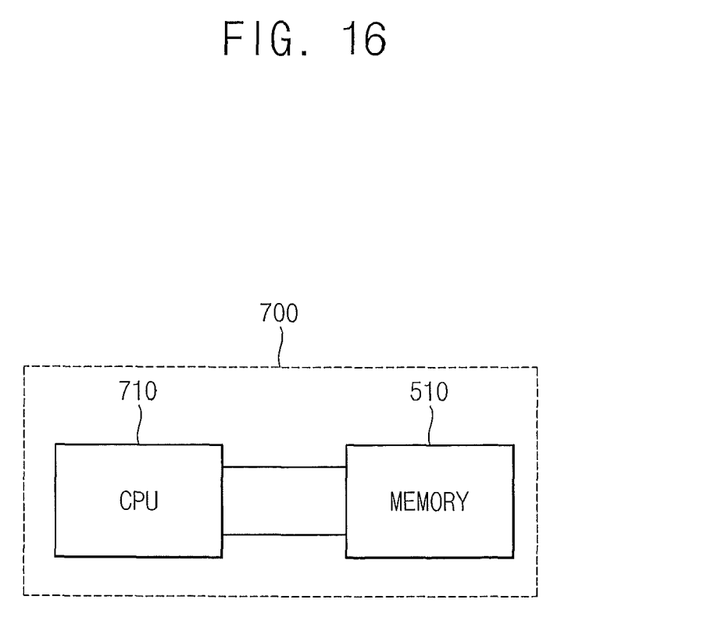
FIG. 16 is a block diagram illustrating an electronic device including the charge trap type memory device in accordance with some example embodiments.

FIG. 16 is a block diagram illustrating an electronic device including the charge trap type memory device in accordance with some example embodiments.

Referring to FIG. 16, the memory 510 may be connected with a central processing unit (CPU) 710 of a computer system 700. The memory 510 may include any one of the charge trap type memory devices in accordance with these example embodiments.

In some example embodiments, the computer system 700 may include a personal computer, a personal data assistant device, etc. The memory 510 may be connected to the CPU 810 directly or indirectly via a bus. The memory 510 may include the recessed channel array transistor of the example embodiments. The planar transistor may be formed in the peripheral region of the memory 510. Although not depicted in drawings, other elements may be constituted in the computer system 700.

According to some example embodiments, the charge-trapping layer may be divided by the charge-blocking pattern having the vertical side profile, so that lateral migrations of charges may inhibited/prevented between the charge-trapping layers. Thus, the charge trap type memory device may have improved characteristics.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a charge trap type memory device, the method comprising:
    forming a tunnel insulating layer on a substrate that has an isolation layer and a stepped active region;
    forming a charge-trapping layer on the tunnel insulating layer;
    forming an oxidation mask on the charge-trapping layer, the oxidation mask being configured to allow oxygen plasma ions to pass through to a portion of the charge-trapping layer over the isolation layer, wherein the oxidation mask is formed to have a portion over the isolation layer that is less thick than other portions of the oxidation mask to allow the oxygen plasma ions to pass therethrough and be implanted in the portion of the charge-trapping layer over the isolation layer;
    converting the portion of the charge-trapping layer over the isolation layer into a charge-blocking pattern having a vertical side profile using an anisotropic oxidation process;
    forming a blocking layer on the charge-trapping layer; and
    forming gate electrodes on the blocking layer, the gate electrodes being electrically isolated from each other by a trench.

2. The method of claim 1, wherein the charge-trapping layer comprises silicon nitride, and the charge-blocking pattern comprises silicon oxide or silicon oxynitride.

3. The method of claim 1, further comprising etching the blocking layer after forming the gate electrodes.

4. The method of claim 1, wherein the anisotropic oxidation process is performed in a plasma chamber to which a bias voltage is applied to direct plasma ions into the portion of the charge-trapping layer.

5. The method of claim 4, further comprising forming the trench through the blocking layer and a conductive layer, which forms the gate electrodes, to expose a portion of the charge-trapping layer.

6. The method of claim 5, wherein the anisotropic oxidation process is performed to implant plasma ions into the portion of the charge-trapping layer aligned with the trench.

7. The method of claim 1, further comprising forming spacers on sidewalls of the gate electrodes.

8. The method of claim 7, wherein:
    the anisotropic oxidation process is performed in a plasma chamber to which a bias voltage is applied to direct plasma ions into the portion of the charge-trapping layer aligned with the trench; and
    the spacers form an implantation mask that further narrows the portion of the charge-trapping layer into which the plasma ions are implanted to form the charge-blocking pattern.

9. A method of manufacturing a charge trap type memory device, the method comprising:
    providing a substrate that has an isolation layer and a stepped active region;
    forming a tunnel insulating layer on the substrate;
    forming a charge-trapping layer on the tunnel insulating layer;
    forming an oxidation mask on the charge-trapping layer, the oxidation mask being configured to allow oxygen plasma ions to pass through to a portion of the charge-trapping layer over the isolation layer;
    converting the portion of the charge-trapping layer over the isolation layer into a charge-blocking pattern having a vertical side profile by an anisotropic oxidation process;
    forming a blocking layer on the charge-trapping layer and the charge-blocking layer; and forming an electrode on the blocking layer,
    wherein the oxidation mask is formed to have a portion over the isolation layer that is less thick than other portions of the oxidation mask to allow the oxygen plasma ions to pass therethrough and be implanted in the portion of the charge-trapping layer over the isolation layer.

10. A method of manufacturing a charge trap type memory device, the method comprising:
    providing a substrate that has an isolation layer and a stepped active region;
    forming a tunnel insulating layer on the substrate;
    forming a charge-trapping layer on the tunnel insulating layer;
    forming an oxidation mask on the charge-trapping layer, the oxidation mask being configured to allow oxygen plasma ions to pass through to a portion of the charge-trapping layer over the isolation layer;
    converting the portion of the charge-trapping layer over the isolation layer into a charge-blocking pattern having a vertical side profile by an anisotropic oxidation process;
    forming a blocking layer on the charge-trapping layer and the charge-blocking layer; and forming an electrode on the blocking layer;
    wherein the oxidation mask is formed to have an opening that exposes the charge-trapping layer over the isolation layer.

* * * * *